United States Patent
Mannarino et al.

(10) Patent No.: US 10,700,649 B2
(45) Date of Patent: Jun. 30, 2020

(54) LOW SWAP CIRCUIT CARD DESIGN FOR RF POWER AMPLIFIERS

(71) Applicant: BAE SYSTEMS Information and Electronic Systems Integration Inc., Nashua, NH (US)

(72) Inventors: Frank A. Mannarino, Wilton, NH (US); Robert Actis, Burlington, MA (US); Robert C. Marion, Pelham, NH (US); John R. Muir, North Chelmsford, MA (US); Steven Rajkowski, East Kingston, NH (US); Eldon M. Sutphin, Merrimack, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 65 days.

(21) Appl. No.: 16/130,155

(22) Filed: Sep. 13, 2018

(65) Prior Publication Data
US 2020/0091875 A1 Mar. 19, 2020

(51) Int. Cl.
| | | |
|---|---|---|
| H03F 3/195 | (2006.01) | |
| H03F 1/02 | (2006.01) | |
| H03F 1/30 | (2006.01) | |
| H03G 3/30 | (2006.01) | |
| H03F 3/213 | (2006.01) | |

(52) U.S. Cl.
CPC .......... *H03F 3/195* (2013.01); *H03F 1/0227* (2013.01); *H03F 1/30* (2013.01); *H03F 3/213* (2013.01); *H03G 3/3042* (2013.01)

(58) Field of Classification Search
CPC ..................................................... H03F 3/195
USPC ......................................................... 330/127
See application file for complete search history.

(56) References Cited

U.S. PATENT DOCUMENTS

| | | | | |
|---|---|---|---|---|
| 7,342,455 | B2* | 3/2008 | Behzad | H03F 1/0205 330/289 |
| 7,369,816 | B2* | 5/2008 | Kappes | H03G 3/3042 330/101 |
| 9,213,345 | B2* | 12/2015 | Butler | H03F 1/52 |
| 9,742,486 | B2* | 8/2017 | Cross | H04B 7/18508 |

(Continued)

*Primary Examiner* — Patricia T Nguyen
(74) *Attorney, Agent, or Firm* — Davis & Bujold, PLLC; Scott J. Asmus

(57) ABSTRACT

A system and method for using an embedded microprocessor in an RF amplifier. The use of an embedded microprocessor avoids manual calibration. The Microprocessor collects initial amplifier performance data based on a set of parameters and calculates the needed corrections. The microprocessor can change levels within the circuit to achieve those operating points. The embedded microprocessor sets voltage levels with internal circuitry and communicates this information externally through a serial communication port, or the like, to allow a user to communicate with and look at the amplifier data and readjust the internal bias levels, as needed. Thus, the internal microprocessor provides for calibration, self-testing, and monitoring of the RF amplifier and also functions as an in situ bias and temperature compensation controller for use in the presence of temperature variation and provides bias sequencing control to protect against improper applied timing of voltage inputs to the amplifier.

17 Claims, 4 Drawing Sheets

(56) References Cited

U.S. PATENT DOCUMENTS

| | | | |
|---|---|---|---|
| 10,250,978 B1* | 4/2019 | Palit | H03G 9/005 |
| 2008/0211583 A1* | 9/2008 | Nguyen | H03F 1/0211 |
| | | | 330/297 |
| 2010/0306722 A1* | 12/2010 | LeHoty | G06F 17/5036 |
| | | | 716/106 |
| 2014/0167852 A1* | 6/2014 | Ishigami | H03F 1/0261 |
| | | | 330/261 |
| 2014/0354350 A1* | 12/2014 | Bowers | H03F 3/195 |
| | | | 327/564 |
| 2017/0047463 A1* | 2/2017 | Hajimiri | H04B 7/0617 |
| 2017/0279412 A1* | 9/2017 | Afsahi | H03F 3/245 |
| 2018/0115287 A1* | 4/2018 | Rabjohn | H03G 3/3042 |

* cited by examiner

LOW SWAP CIRCUIT CARD DESIGN FOR RF POWER AMPLIFIERS

FIELD OF THE DISCLOSURE

The present disclosure relates to radio frequency amplifiers and more particularly to a circuit card assembly for intelligent power amplifier control.

BACKGROUND OF THE DISCLOSURE

It is understood that conventional amplifier designs have several opportunities for improvement. This becomes readily apparent when the amplifiers are deployed in applications where size, weight and power are limited factors. First, direct current electronic components occupy a significant percentage of the total amplifier volume, and in many amplifier applications, space and weight come at a premium. Multiple internal voltages are required (e.g., +24V, +5V, +3.3V, −4V, −5V) and in some applications the use of on-board regulators are incorporated for each of the required voltages to reduce the potential susceptibility to electromagnetic fields which may be present in the external environment. Confining the amplifier power interface to a single input voltage, which is immediately followed by internal regulators, allows filtering of noise which might otherwise be injected by those external fields. In addition to maintaining regulation of the various voltage levels it is important in some cases that the turn on and turn off of the individual voltages be properly sequenced to avoid catastrophic damage. Another factor of the size, weight and power constraints in some applications is thermal management. An amplifier that operates at full power may generate heat that can raise the internal operating temperatures which affects the performance of the amplifier as well as other components. This can lead to lower performance and less than optimal operation.

Conventional systems require multiple input connector pins and have a costly die and wire bond construction, with multiple adjustment points (e.g., delay times, offsets, scale factor) in order to provide for applying different voltages prior to and after a prescribed burn-in period associated with the semiconductor die used in the amplifier. Currently, these systems require invasive, labor intensive trim processes utilizing wire bonds and thin film resistor networks to provide for needed optimization of gate bias operating points and performance across the operating temperature range. Further, the high component count present in conventional systems requires significant board area and the currently available single slope temperature compensation are less than ideal.

Wherefore it is an object of the present disclosure to overcome the above-mentioned shortcomings and drawbacks associated with the conventional radio frequency amplifiers.

SUMMARY OF THE DISCLOSURE

It has been recognized that significant technical advances are needed to meet the ever-increasing challenges of size, weight and power required for the next generation of RF Power Amplifiers. This disclosure describes a design which incorporates solutions to the specific issues of amplifier control, power regulation/sequencing, and temperature compensation. Further, it accomplishes these features with unprecedented volume efficiency, greatly reduces the in-process testing and data collection labor associated with current calibration methods and greatly reduces the risk of damage inherent in current invasive methods of power amplifier setup and calibration.

One aspect of the present disclosure is a system incorporating an on-board microcontroller, data storage, voltage regulators, current, temperature and power sensors, as well as communication ports which enable control of the power amplifier performance from the external environment.

In one embodiment of the system, initial power up is controlled autonomously by the on-board analog voltage regulators and sequencing circuitry. Subsequent functions including initial performance monitoring, parametric optimization, performance data collection, and storage are controlled by a microcontroller. Interface to the amplifier is conducted via a serial data bus which allows subsequent updating of the various set points and temperature compensation profile.

One aspect of the present disclosure is a method of calibrating or testing a radio frequency amplifier, comprising: collecting, via an embedded microprocessor, initial amplifier performance data; calculating, via the embedded microprocessor, changes to levels within a one or more internal circuits to achieve optimal amplifier performance; setting, via the embedded microprocessor, levels within the one or more internal circuits according to the changes calculated by the embedded microprocessor; monitoring, via the embedded microprocessor, amplifier performance data; and, optionally, communicating to a user, via the embedded microprocessor, the amplifier performance data.

One embodiment of the method of calibrating or testing a radio frequency amplifier further comprises storing amplifier data, including calibration data, in nonvolatile memory.

Another embodiment of the method of calibrating or testing a radio frequency amplifier further comprises electronically storing a unique identification number that can be used to track and maintain hardware/software configuration control via an external link. This is a means of verifying, via an external connector, the identity of the amplifier in question. It is a verification of the internal configuration. Conventionally, this information is maintained with external records such as route cards which can be in error.

Yet another embodiment of the method of calibrating or testing a radio frequency amplifier further comprises storing amplifier software in nonvolatile memory and updating amplifier software via an external link without having to disassemble the amplifier.

In some cases, the method of calibrating or testing a radio frequency amplifier further comprises allowing, via the embedded microprocessor, the user to readjust internal bias levels for the amplifier.

Another embodiment is wherein communicating externally utilizes a serial communication port. In some cases, periodic system/amplifier level calibration can be performed using the serial communication port.

In still yet another embodiment of the method of calibrating or testing a radio frequency amplifier, changes to levels comprises changes to amplifier gate voltages, temperature compensation slopes, scale factors, inflection points, and the like. In some cases, initial amplifier performance data comprises current, temperature, input power, and output RF power data.

Another aspect of the present disclosure is a method of controlling a radio frequency amplifier, comprising: collecting, via an embedded microprocessor, initial amplifier performance data resulting from a single power input; calculating, via the embedded microprocessor, changes to voltage levels and bias levels within one or more internal circuits to achieve optimal amplifier performance; setting, via the embedded microprocessor, the voltage levels and bias levels within the one or more internal circuits according to the changes calculated by the embedded microprocessor; providing, via the embedded microprocessor, power sequencing control to protect against improper applied timing of voltage inputs to the amplifier; monitoring, via the embedded microprocessor, amplifier performance data; and, optionally, communicating externally to a user, via the embedded microprocessor, the amplifier performance data.

One embodiment of the method of controlling a radio frequency amplifier further comprises changing attenuation/gain levels to ensure constant RF output over time and temperature to allow for the use of the same amplifier in different attenuation/gain configurations.

Another embodiment of the method of controlling a radio frequency amplifier is wherein communicating with the microcontroller after sealing of the amplifier housing provides the capability to further modify operating points and temperature compensation without invasive de-lidding of the amplifier package. In some cases, the method of controlling a radio frequency amplifier further comprises providing a power-on, self-test as well as continuous monitoring of amplifier parameters to eliminate catastrophic failures that could occur if left unchecked.

Yet another embodiment of the method of controlling a radio frequency amplifier further comprises providing an on-demand, self-test of the amplifier parameters for trouble shooting at the amplifier as well as monitoring during production and environmental testing.

Still yet another embodiment of the method of controlling a radio frequency amplifier further comprises changing bias levels and/or altering the characteristics of an electronically controlled input/output matching network allowing for more efficient operation and meeting input/output impedance requirements.

Yet another aspect of the present disclosure is a method of providing a burn-in, bias-readjustment for a radio frequency amplifier, comprising: collecting time data, via an embedded microprocessor, to determine a burn-in time; collecting, via an embedded microprocessor, initial amplifier performance data; calculating, via the embedded microprocessor, changes to bias levels or voltage levels within a one or more internal circuits to achieve optimal amplifier performance; setting, via the embedded microprocessor, the bias levels or voltage levels within the one or more internal circuits; monitoring, via the embedded microprocessor, amplifier performance data; and, optionally, communicating to a user, via the embedded microprocessor, the amplifier performance data.

These aspects of the disclosure are not meant to be exclusive and other features, aspects, and advantages of the present disclosure will be readily apparent to those of ordinary skill in the art when read in conjunction with the following description, appended claims, and accompanying drawings.

BRIEF DESCRIPTION OF THE DRAWINGS

The foregoing and other objects, features, and advantages of the disclosure will be apparent from the following description of particular embodiments of the disclosure, as illustrated in the accompanying drawings in which like reference characters refer to the same parts throughout the different views. The drawings are not necessarily to scale, emphasis instead being placed upon illustrating the principles of the disclosure.

DETAILED DESCRIPTION OF THE DISCLOSURE

Figure 1:
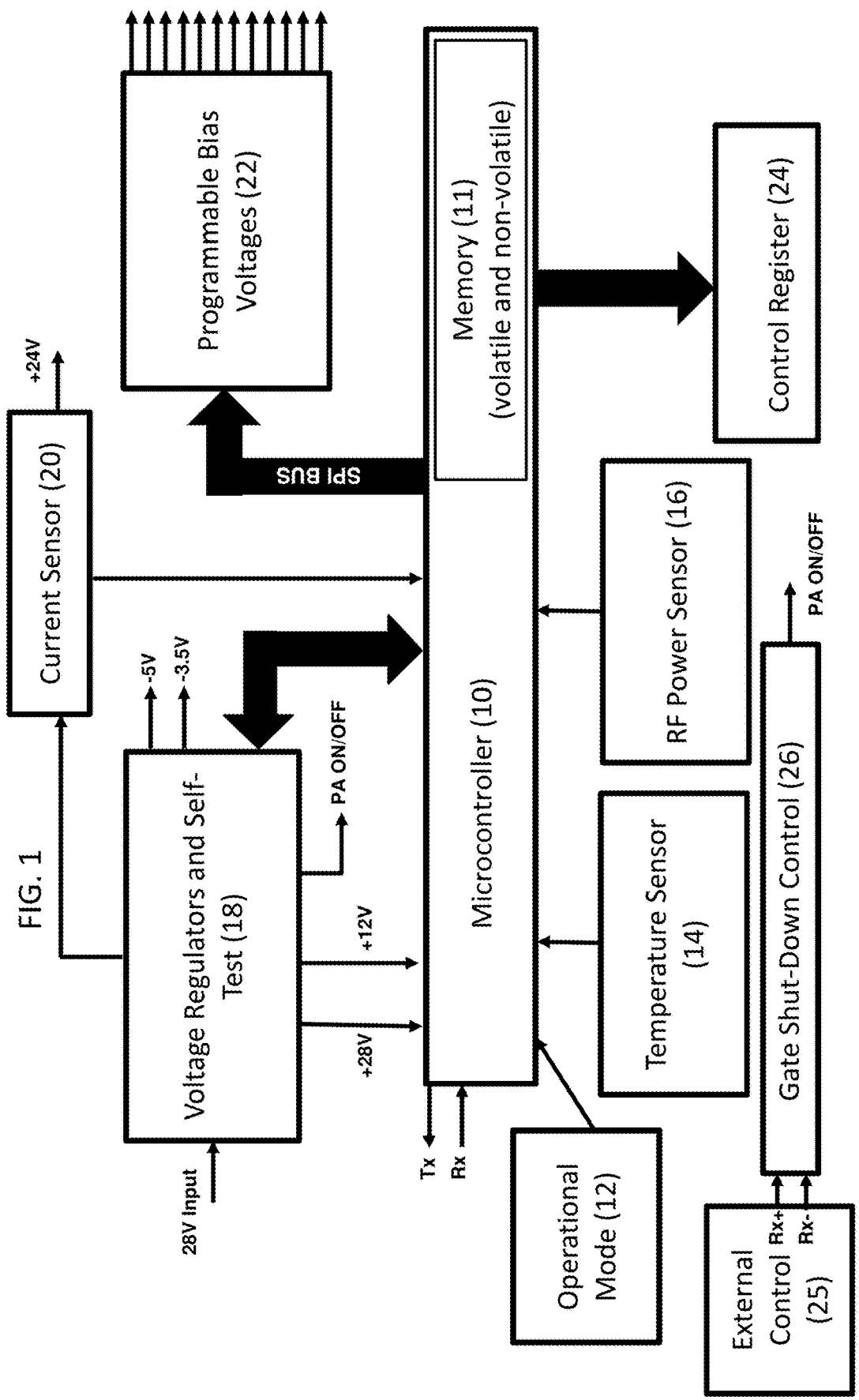
FIG. 1 shows one embodiment of a direct-current control card block diagram according to the principles of the present disclosure.

In certain embodiments, radio frequency (RF) amplifiers produce microwave power at a high frequency and also require low frequency timing and control signals for biasing networks. In one example the amplifier is between a matching network and a load network. The RF input from the matching network is amplified by the RF amplifier and provided to the load network. The amplifier is coupled to a bias network that controls the operations of the amplifier and in certain situations optimizes performance based on the operating conditions and desired outcome.

Both positive and negative voltages ranging up to approximately 50V may be required depending on the specific end use application. RF amplifiers also require temperature compensation in order to provide stable operation over operating temperature ranges, typically −40° to +85° C. Presently, selecting the components to provide proper biasing and temperature compensation is very labor intensive. Generally, this requires a relatively invasive procedure that physically modifies the hardware. In order to select the correct components, detailed temperature characterization is required to determine what in situ changes must be incorporated. Currently, the typical way to make the changes is to break wire bonds and re-wire bond new connections. This generally is time-consuming and requires multiple tests to finalize the optimum design.

Generally, circuit cards are implemented in micro-electric modules (e.g., a board with various switching devices) and this requires applying voltages to MMICs/chips and having to set voltages to the MMICs by using different bond wire locations. Each time a voltage needs to be changed or set, a bond wire connection must be physically broken and a new bond wire connection at an alternate location must be installed. This is referred to as the chip and wire approach. Requirements for high power amplifiers (HPAs) are getting more complicated and this means more switching functions are needed. Many HPAs also need to be smaller leaving less area to work with to accomplish the needed bias control functionality.

One embodiment of the present disclosure provides a solution, where a microprocessor is used internally as a part of the system. The embedded microprocessor does the initial data collection of the amplifier's performance based on a set of parameters. It then calculates the needed corrections, and it can change levels (e.g., amplifier gate voltages, temperature compensation slopes, scale factors, inflection points, etc.) within the circuit to achieve those required operating points. The embedded microprocessor sets voltage levels with internal circuitry. In one embodiment, the system communicates this information externally through a serial communication port, or the like. This allows a tester or other user to communicate with and look at the amplifier data. In one example the user can readjust the internal bias levels. As used herein, the terms microprocessor and microcontroller are used interchangeably and refer to one or more processing units that are co-located with the amplifier.

In certain embodiments, the processor can implement corrections to an operating point (e.g., voltage) or a temperature compensation profile. No physical modification of the hardware is needed. In certain embodiments, the process is done using automatic data collection. As a result, test labor that used to take many hours is reduced to almost nothing. The system and method of the present disclosure also allows one to make modifications at a later time without having to break wire bonds as the modifications are all done electronically.

This solution in one embodiment is reprogrammable and correspondingly less invasive because there is no need to de-lid the microcircuit, which is a risky operation otherwise, while also significantly saving labor costs. This solution also gives a permanent record of the amplifier data and settings involved with the amplifier's ongoing operation. It is also a more accurate solution with the capability of creating multiple slope temperature compensation profiles and finer incremental adjustments of bias voltage levels.

One embodiment of the present disclosure has two degrees of freedom relating to the best fit for performance over the temperature range, i.e. the ability to insert multiple slopes for the best curve fit of bias vs temperature. However, this system and method has no limit as to the number of breaks and slopes that can be applied to determine data. Additionally, the microprocessor allows the RF amplifier to be optimized regarding performance (e.g., temperature compensation, real time dynamic control of the amplifier characteristics, and the like). This allows for dynamic control of the amplifier so that it can adjust to a changing environment and operational requirements while maintaining optimal performance. In some cases, the amplifier is a microwave amplifier. In certain embodiments, the system can be extended to acoustic and optical amplification systems as well. The present disclosure provides simpler system integration via a single voltage supply and lower manufacturing costs by reducing the bonding process associated with physically setting the bias voltages via bondable resistor selection to accommodate the transition characteristic variability from wafer-to-wafer.

In certain embodiments of the present disclosure, the system is present on an Application Specific Integrated Circuit (ASIC). One of the functions performed by the circuit would be to electronically program temperature compensation for optimal gain and power. Another function would be to electronically program bias settings to maintain the conditions that enable optimal gain and power levels and adjust to any changes and performance requirements. In some embodiments, a serial communication port for RF switch driver control and diagnostics would be included. In yet other cases, an analog voltage monitor BIT proportional to RF output power would be present.

Referring to FIG. 1, one embodiment of a direct-current control card block diagram according to the principles of the present disclosure is shown. The terms DC and/or direct-current are used throughout this disclosure to describe the proposed circuit board functions as a whole. The terminology was adopted to distinguish these low frequency and in many cases, static, voltage signals and levels from the much higher RF circuitry. In fact these low frequency signals are generally all voltage controlled.

Still referring to FIG. 1, a microcontroller (10) is utilized to provide multiple functions for the RF amplifier. As illustrated, the microcontroller (10) in this example is co-located with the amplifier on the same board. Both volatile and non-volatile memory (11) used for this particular implementation are included within the microcontroller. Internal to the microcontroller is where parametric information and software are stored. The desired functions performed according to one embodiment are commanded via an Operational Mode select input (12). One available mode provides for collection of performance data from internal monitors such as current, temperature (14), input power (20), and RF output power (16). This can be done during initial testing and/or calibration. The term calibration as used herein encompasses, not only calibration (traceability to standards), but relative alignment data. In some cases (such as impedance matching) it is optimization rather than calibration that is performed.

Voltage, current, temperature, and RF power sensors can be located in one or more locations depending upon the board design, operating conditions and/or required performance. This parametric data can be stored in on-board memory (11) or communicated to an external test port. Based on data collected, the processor or microcontroller (10) can then apply that data in the generation of gate bias voltages (22) when a Normal Run mode is commanded. Additional modes of operation can easily be added by utilizing the versatility of the microprocessor. Responsibility for regulating and converting the +24 VDC input power, followed by generation and sequencing of the various required voltages is shared between the microcontroller (10) and a group of discrete analog voltage regulators (18).

A dedicated interface (26) such as the gate shut-down control provides direct on/off control of the amplifier via an external control 25 that is capable of high speed control that for some applications needs to be faster than the microcontroller can provide. The Control Register 24 provides digital control for various items such as turning regulators "on"/"off", indicators, etc.

Still referring to FIG. 1, one embodiment of a direct-current control card block diagram according to the principles of the present disclosure is shown. More specifically, at least one microcontroller (10) is utilized to provide multiple functions for the RF amplifier. The microcontroller (10) can be a dedicated microcontroller or a shared microcontroller proving multiple functions. The desired functions performed are commanded via an Operational Mode Select input (12). One available mode provides for collection of performance data from internal monitors such as current, temperature (14), input power (20), and RF output power (16) during initial testing and calibration. This parametric data can be stored in on-board memory (11) or communicated via an external test port. Based on data collected, the processor can then apply that data in the generation of gate bias voltages (22) when Normal Run mode is commanded such that current draw of individual power amplifiers can be individually monitored and adjusted by programmable gate bias voltages (22). Additional modes of operation can easily be added by utilizing the versatility of the microprocessor. Other possible modes are Auto-Bias, Spare, and the like.

Auto-Bias would be a continuous, autonomous refining and updating of the gate bias levels to ensure optimum performance as the components age. Additional modes could be used for tasks like data recording and recovery of performance levels during extended environmental or life testing. Spare may indicate the ability to accept control commands from more than one external source. Oftentimes semiconductor MMICs will exhibit signs of "aging" where performance will lower or degrade over time. The time can be measured in 1000s of hours and performance degradation may be in the "less-than-one-half of a dB" range, but the ability to 'regain' some of any degradation or loss of performance by readjusting bias can provide a significant advantage to some systems.

In addition to gate biasing, other modes may include such items as self-test, monitoring, field testing, environmental testing, data tracking, re-biasing for age, reprogramming the microcontroller, etc. Auto-bias was envisioned as being invoked only once in a while such as after burn-in or aging under controlled environmental conditions. In normal operation, the microcontroller would be used to adjust the gate bias and attenuation/gain relative to temperature such that the performance remains constant over temperature.

Compensation slopes usually refer to an attenuation profile vs temperature relationship. Therefore as temperature changes, differing levels of attenuation are introduced in a manner to keep the over amplifier performance constant as a function of temperature. At temperatures where gain is higher, more attenuation is introduced. In areas of temperature where gain is lower, less attenuation is invoked to retain the same constant amplifier performance (usually gain or output power). The microcontroller can achieve the same compensation characteristic from the amplifier perspective, by using bias control to the transistors to increase or decrease overall amplifier output power or gain vs temperature.

In another example, during the operation of the amplifier, the amplifier performance may change due to, for example, environmental conditions. The current, temperature (14), input power (20), and RF output power (16) sensors would dynamically measure the performance characteristics and provide that to the microcontroller (10). These measurements in one example are done intermittently at pre-defined time periods. The microcontroller (10) would then review the sensor data and make changes to the bias voltages (22) that would modify the amplifier performance to improve the overall output. Subsequent measurements may be used to monitor the performance and ensure that performance has improved.

In a further example for an Auto-Bias mode, the amplifier performance will be monitored and automatically track a pre-defined set of parameters. For example, the input power (20) can be measured and monitored by the microcontroller according to some pre-defined performance criteria and the bias voltages adjusted to maintain the amplifier according to the measured data. In normal operation, the microcontroller would be used to adjust the gate bias and attenuation/gain relative to temperature such that the performance remains constant over temperature. If the gain is low, the bias cannot be increased indefinitely. Similarly, the output power can be the tracking parameter such that the measured RF output power (16) would be automatically adjusted to maintain a certain level by continually adjusting the bias voltages.

Responsibility for regulating and converting the +24 VDC input power and generation and sequencing of the various required voltages is shared between the microcontroller (10) and a group of discrete analog voltage regulators (18). In some cases, there are +24V, +5V, +12V, −6V, −5V, and −3.5V regulators. A dedicated interface (26) provides direct on/off high-speed control of the amplifier via an external control (25). In some cases, this dedicated interface comprises two or more receivers.

In certain embodiments, the programmable bias voltages are possible using multiple digital to analog converters (DAC). In some cases serial DAC and buffers are used. The DAC output is fed into gates and attenuators. In one embodiment, a total of twelve channels were used ranging from 0 to −6V, with some of the channels being spares or for redundancy.

Figure 2:
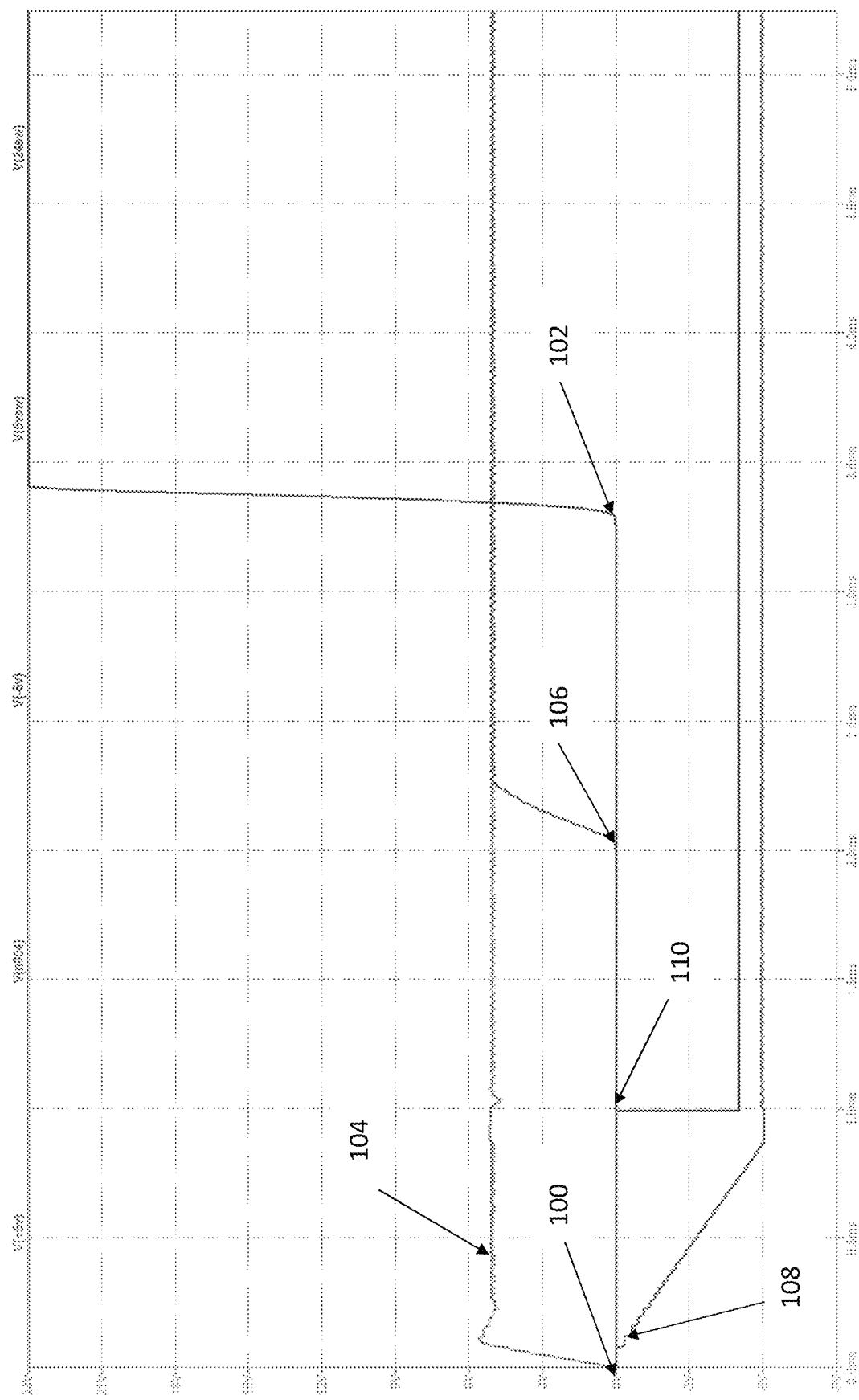
FIG. 2 shows a plot of input voltage with sequencing of turn-on simulation according to one embodiment of the present disclosure.

Referring to FIG. 2, a plot of input voltage with sequencing of turn-on simulation according to one embodiment of the present disclosure is shown. More specifically, a +24 VDC input voltage (not shown) was applied at $t_0$ (point 100). This immediately provides power to internal +5 VDC and −6 VDC voltage regulators. Within approximately 0.2 milliseconds (ms) the first voltage to stabilize is the +5 VDC (trace 104) which provides power to all internal command and control circuitry including the microcontroller. At 0.8 ms the −6 VDC voltage (trace 108) achieves regulation which provides input bias for a secondary −5 VDC voltage reference. This −5 VDC reference is enabled (made available to) the microwave amplifier gates at 1.0 ms (point 110). A secondary +5 VDC regulator is turned on after 2 ms (point 106) which provides power to additional internal circuitry. At 3.3 ms all internal circuitry has stabilized and +24 VDC is finally connected to the amplifier drains (point 102).

Figure 3:
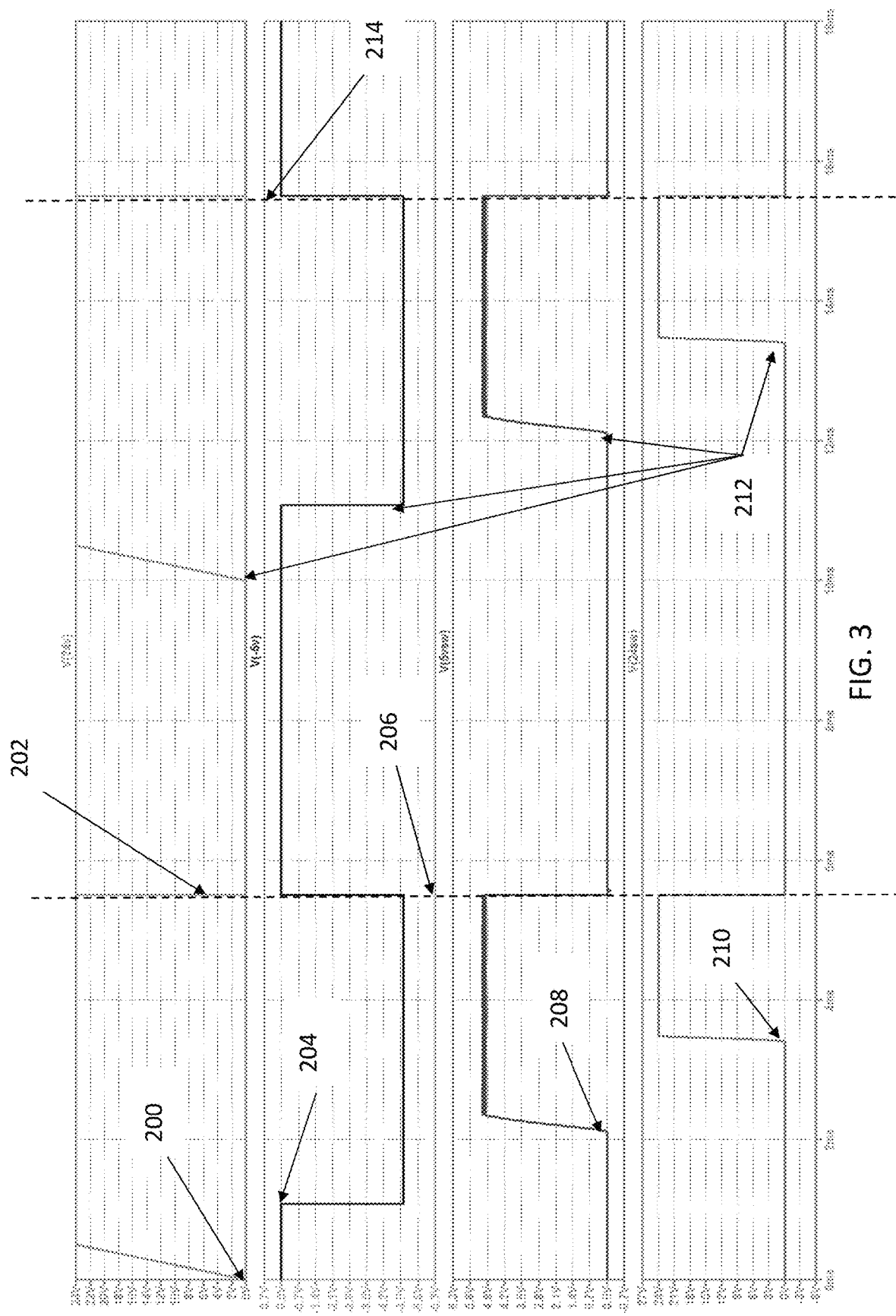
FIG. 3 shows a plot of input voltage with sequencing of turn-on/turn-off simulation according to one embodiment of the present disclosure.

Referring to FIG. 3, a plot of input voltage with sequencing of turn-on/turn-off simulation according to one embodiment of the present disclosure is shown. More specifically, a +24 VDC input is applied at 0 ms (point 200). Similar to the sequence shown in FIG. 2, the second trace from the top of the figure shows a −5 VDC being turned on at about 1 ms (point 204), the third trace from the top shows +5 VDC being turned on at about 2.1 ms (point 208), and the bottom trace shows a +24 VDC switch being turned on at about 3.5 ms (point 210). At 5.5 ms (point 202), total system power down has been initiated by removal of the +24 VDC input power, and all internal voltages likewise return to zero (point 206). The simultaneous shutdown of all voltages is only one of many turn off sequences which are available. Turn off can be in the reverse order from turn on or any other sequential combination desired. A repeat of the above sequence follows starting with reapplication of the +24 VDC at 10 ms (point 202), subsequent turn on of the secondary regulators (points 212), and final shutdown at 15.5 ms (point 214).

Figure 4:
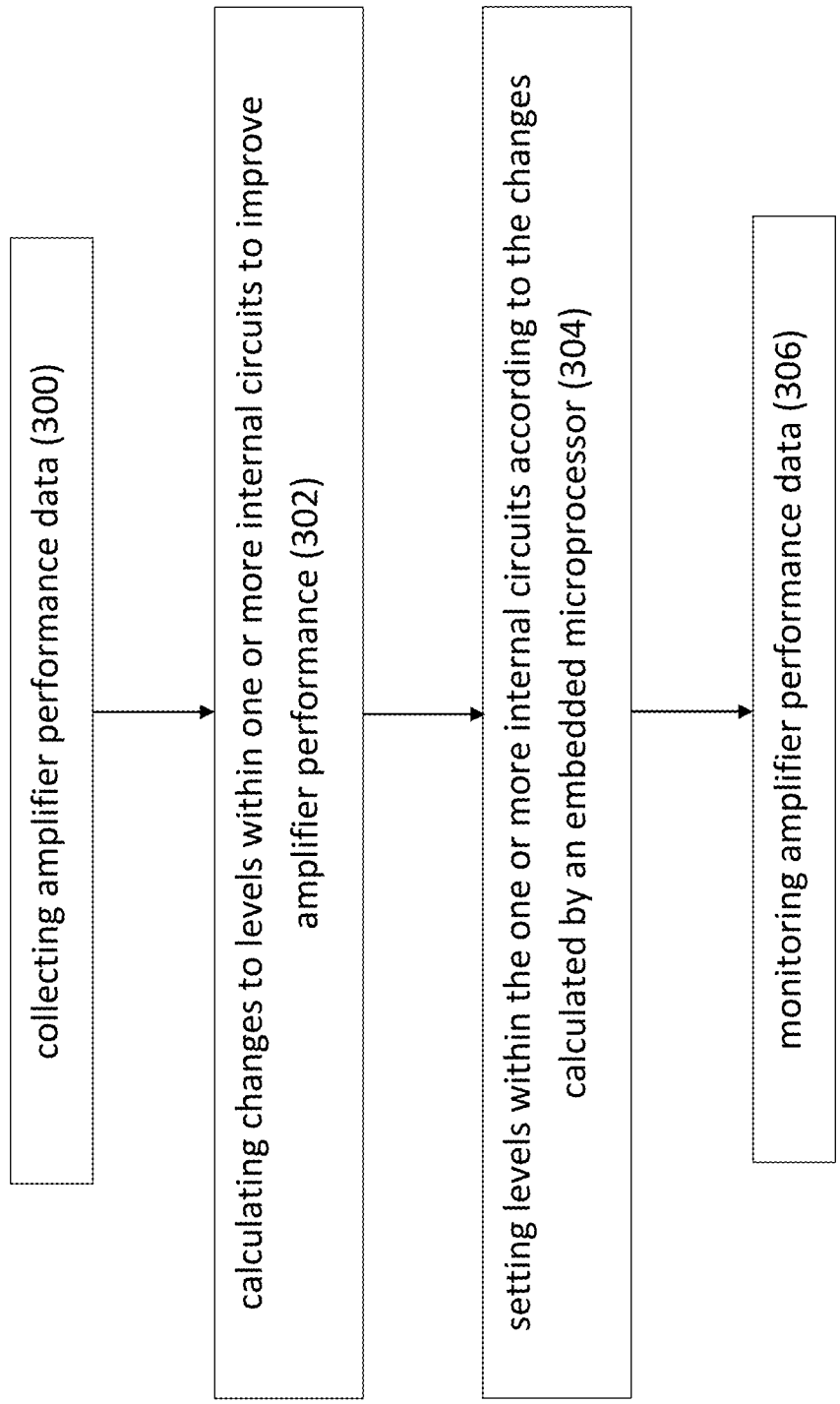
FIG. 4 shows a flowchart of one embodiment of the present disclosure.

Referring to FIG. 4, a flowchart depiction according to one embodiment is illustrated. More specifically, the method collects via an embedded microprocessor initial amplifier performance data 300 and then calculates via the embedded microprocessor changes to levels within one or more internal circuits to achieve optimal amplifier performance 302. The calculated changes are then used to set amplifier values, via the embedded microprocessor, within the one or more internal circuits according to the changes calculated by the embedded microprocessor 304; and then the system monitors, via the embedded microprocessor, the amplifier performance data 306. The process can be iterative or done upon system set up. In some cases, the process is automatic and in others it is user generated. In some cases, the results of the calculations for each of the various amplifier parameters are communicated to the user. In certain embodiments, the amplifier data and settings are stored for later analysis.

According to one embodiment, the adjustments to the bias voltages are done dynamically during operation. The adjustments to the bias voltages can also be part of a regular test/calibration procedure or it can be upon a request. The process would collect the data and establish updated or adjusted values for amplifier parameters. In some cases, the system is configured to adjust the many controllable parameters of the amplifier (i.e., bias voltage, bias current, input drive power, and possible impedance-match) to extract the best combination or compromise of amplifier performance. When multiple amplifier performance parameters are desired to be maximized (or optimized), there are usually compromises to enable the combination of amplifier parameters to be achieved. Some parameters are related and maximizing one performance parameter will result in the lowering of another one. An example of this would be "optimizing" for the highest RF power, and highest amplifier efficiency (i.e., lowest dc-power for the highest RF power). The best or optimal combination may be a RF power level or efficiency that is not the absolute maximum, but a sufficient compromise to maximize the combination of the two. Oftentimes, a "figure of merit" is proposed such as the multiplication of two parameters, which are maximized. An example of such a figure of merit is the power-bandwidth product (i.e., the maximum frequency bandwidth multiplied by the maximum RF power). As used herein, the word 'optimize' refers to maximizing a performance parameter in a manner as to not give up too much of another performance parameter which is related and may be affected by the other performance parameter.

The computer readable medium as described herein can be a data storage device, or unit such as a magnetic disk, magneto-optical disk, an optical disk, or a flash drive. Further, it will be appreciated that the term "memory" herein is intended to include various types of suitable data storage media, whether permanent or temporary, such as transitory electronic memories, non-transitory computer-readable medium and/or computer-writable medium.

It will be appreciated from the above that the invention may be implemented as computer software, which may be supplied on a storage medium or via a transmission medium such as a local-area network or a wide-area network, such as the Internet. It is to be further understood that, because some of the constituent system components and method steps depicted in the accompanying Figures can be implemented in software, the actual connections between the systems components (or the process steps) may differ depending upon the manner in which the present invention is programmed. Given the teachings of the present invention provided herein, one of ordinary skill in the related art will be able to contemplate these and similar implementations or configurations of the present invention.

It is to be understood that the present invention can be implemented in various forms of hardware, software, firmware, special purpose processes, or a combination thereof. In one embodiment, the present invention can be implemented in software as an application program tangible embodied on a computer readable program storage device. The application program can be uploaded to, and executed by, a machine comprising any suitable architecture.

While various embodiments of the present invention have been described in detail, it is apparent that various modifications and alterations of those embodiments will occur to and be readily apparent to those skilled in the art. However, it is to be expressly understood that such modifications and alterations are within the scope and spirit of the present invention, as set forth in the appended claims. Further, the invention(s) described herein is capable of other embodiments and of being practiced or of being carried out in various other related ways. In addition, it is to be understood that the phraseology and terminology used herein is for the purpose of description and should not be regarded as limiting. The use of "including," "comprising," or "having," and variations thereof herein, is meant to encompass the items listed thereafter and equivalents thereof as well as additional items while only the terms "consisting of" and "consisting only of" are to be construed in a limitative sense.

The foregoing description of the embodiments of the present disclosure has been presented for the purposes of illustration and description. It is not intended to be exhaustive or to limit the present disclosure to the precise form disclosed. Many modifications and variations are possible in light of this disclosure. It is intended that the scope of the present disclosure be limited not by this detailed description, but rather by the claims appended hereto.

A number of implementations have been described. Nevertheless, it will be understood that various modifications may be made without departing from the scope of the disclosure. Although operations are depicted in the drawings in a particular order, this should not be understood as requiring that such operations be performed in the particular order shown or in sequential order, or that all illustrated operations be performed, to achieve desirable results.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure.

What is claimed:

1. A method of operating a radio frequency amplifier, comprising:
   providing amplifier performance data from one or more sensors to an embedded microprocessor co-located with the amplifier;
   calculating, via the embedded microprocessor, changes to a gate bias within one or more internal circuits to achieve optimization of the gate bias;
   readjusting after a burn-in period, via the embedded microprocessor, the gate bias levels within the one or more internal circuits according to the changes calculated by the embedded microprocessor, wherein the readjusting of the gate bias requires no physical modification of the amplifier; and
   monitoring the amplifier performance data.

2. The method of operating the radio frequency amplifier according to claim 1, further comprising communicating the amplifier performance data to a user.

3. The method of operating the radio frequency amplifier according to claim 1, further comprising storing the amplifier data, including calibration data, in nonvolatile memory.

4. The method of operating the radio frequency amplifier according to claim 3, further comprising storing in electronic memory a unique identification number that can be used to track and maintain hardware/software configuration control via an external link.

5. The method of operating the radio frequency amplifier according to claim 3, further comprising storing amplifier software in the nonvolatile memory and updating amplifier software via an external link without having to disassemble the amplifier.

6. The method of operating the radio frequency amplifier according to claim 2, wherein communicating the amplifier performance data to a user utilizes a serial communication port.

7. The method of operating the radio frequency amplifier according to claim 6, further comprising measuring the amplifier data from the sensors and dynamically controlling the amplifier by changing one or more bias voltages.

8. The method of operating the radio frequency amplifier according to claim 1, wherein changes to the gate bias comprises changes to one or more amplifier gate voltages, temperature compensation slopes, scale factors, and inflection points.

9. The method of operating the radio frequency amplifier according to claim 1, wherein the amplifier performance data comprises current, temperature, input power, and output RF power data.

10. A method of controlling a radio frequency amplifier, comprising:
    collecting, via an embedded microprocessor, amplifier performance data resulting from a single power input;
    calculating, via the embedded microprocessor, any needed changes to internal bias levels within one or more internal circuits to achieve optimization of the internal bias levels;
    setting after a burn-in period, via the embedded microprocessor, the internal bias levels within the one or more internal circuits according to the changes calculated by the embedded microprocessor, wherein the setting of the internal bias levels requires no physical modification of the amplifier;
    providing, via the embedded microprocessor, power sequencing control to protect against improper applied timing of voltage inputs to the amplifier; and
    monitoring, via the embedded microprocessor, amplifier performance data.

11. The method of controlling the radio frequency amplifier according to claim 10, further comprising communicating the amplifier performance data to a user.

12. The method of controlling the radio frequency amplifier according to claim 10, further comprising changing attenuation/gain levels to ensure constant RF output over time and temperature to allow for the use of the same amplifier in different attenuation/gain configurations.

13. The method of controlling the radio frequency amplifier according to claim 10, comprising communicating with the microcontroller after sealing of the amplifier housing and modifying operating points and temperature compensation without invasive de-lidding of the amplifier package.

14. The method of controlling the radio frequency amplifier according to claim 10, further comprising providing a power-on, self-test as well as continuous monitoring of amplifier parameters to eliminate catastrophic failures that could occur if left unchecked.

15. The method of controlling the radio frequency amplifier according to claim 10, further comprising providing an on-demand self-test of the amplifier parameters for trouble shooting the amplifier or monitoring during production and environmental testing.

16. The method of controlling the radio frequency amplifier according to claim 10, further comprising changing bias levels and/or altering the characteristics of an electronically controlled input/output matching network allowing for more efficient operation and meeting input/output impedance requirements.

17. A method of providing a burn-in, bias-readjustment for a radio frequency amplifier, comprising:
    collecting time data, via an embedded microprocessor, to determine a burn-in time;
    collecting, via an embedded microprocessor, initial amplifier bias levels;
    calculating, via the embedded microprocessor, any needed changes to internal bias levels within a one or more internal circuits to achieve optimization of the internal bias levels;
    setting, setting after a burn-in time, via the embedded microprocessor, the internal bias levels within the one or more internal circuits, wherein the setting of the internal bias levels requires no physical modification of the amplifier;
    monitoring, via the embedded microprocessor, amplifier performance data; and
    communicating to a user, via the embedded microprocessor, the amplifier performance data.

\* \* \* \* \*